(12) United States Patent
Nakatani et al.

(10) Patent No.: US 8,193,526 B2
(45) Date of Patent: Jun. 5, 2012

(54) TRANSISTOR HAVING AN ORGANIC SEMICONDUCTOR WITH A HOLLOW SPACE

(75) Inventors: Seiichi Nakatani, Osaka (JP); Yoshihisa Yamashita, Kyoto (JP); Takashi Kitae, Osaka (JP); Susumu Sawada, Osaka (JP)

(73) Assignee: Panasonic Corporation, Osaka (JP)

( * ) Notice: Subject to any disclaimer, the term of this patent is extended or adjusted under 35 U.S.C. 154(b) by 181 days.

(21) Appl. No.: 12/672,135

(22) PCT Filed: Aug. 6, 2008

(86) PCT No.: PCT/JP2008/002123
§ 371 (c)(1),
(2), (4) Date: Feb. 4, 2010

(87) PCT Pub. No.: WO2009/019864
PCT Pub. Date: Feb. 12, 2009

(65) Prior Publication Data
US 2011/0204367 A1 Aug. 25, 2011

(30) Foreign Application Priority Data
Aug. 7, 2007 (JP) .................................. 2007-205202

(51) Int. Cl.
*H01L 51/00* (2006.01)

(52) U.S. Cl. ................. 257/40; 257/66; 438/99; 438/34

(58) Field of Classification Search ............... 257/40, 257/66; 438/99, 34
See application file for complete search history.

(56) References Cited

U.S. PATENT DOCUMENTS

| 5,869,361 | A | 2/1999 | Cho |
| 2004/0075093 | A1* | 4/2004 | Arai et al. ............... 257/66 |
| 2004/0201107 | A1 | 10/2004 | Koenenkamp |

(Continued)

FOREIGN PATENT DOCUMENTS

DE  198 00 919  1/1999

(Continued)

OTHER PUBLICATIONS

International Search Report issued Sep. 2, 2008 in International (PCT) Application No. PCT/JP2008/002123.

(Continued)

*Primary Examiner* — N Drew Richards
*Assistant Examiner* — Peter Bradford
(74) *Attorney, Agent, or Firm* — Wenderoth, Lind & Ponack, L.L.P.

(57) ABSTRACT

A semiconductor device having a semiconductor elements formed with higher density is provided. Furthermore an image display device using the semiconductor device is also provided.

A semiconductor device comprising a resin film that has a through hole that penetrates from one surface to the other surface thereof, a source electrode disposed along the inner wall of the through hole, a drain electrode disposed along the inner wall of the through hole, a gate electrode disposed on the other surface of the resin film opposing the through hole, an insulating layer disposed on the gate electrode at the bottom of the through hole and an organic semiconductor disposed in the through hole so as to contact the source electrode and the drain electrode, wherein the organic semiconductor makes contact with at least a part of the insulating layer at the bottom of the through hole so that a channel is formed in the organic semiconductor in the vicinity of the insulating layer that is in contact therewith.

19 Claims, 13 Drawing Sheets

U.S. PATENT DOCUMENTS

| | | | |
|---|---|---|---|
| 2005/0062065 A1 | 3/2005 | Hirakata et al. | |
| 2006/0110294 A1* | 5/2006 | Engstrom et al. | 422/100 |
| 2006/0131568 A1* | 6/2006 | Meng et al. | 257/40 |
| 2006/0284181 A1* | 12/2006 | Chae et al. | 257/66 |
| 2007/0023837 A1* | 2/2007 | Lee et al. | 257/347 |
| 2007/0158744 A1* | 7/2007 | Song et al. | 257/347 |
| 2008/0241990 A1* | 10/2008 | Kim et al. | 438/99 |
| 2010/0264408 A1* | 10/2010 | Bale et al. | 257/40 |

FOREIGN PATENT DOCUMENTS

| | | |
|---|---|---|
| EP | 1027988 A1 * | 8/2000 |
| JP | 2005-503042 | 1/2005 |
| JP | 2005-302893 | 10/2005 |
| JP | 2006-186294 | 7/2006 |
| JP | 2006-261426 | 9/2006 |
| JP | 2007-67263 | 3/2007 |

OTHER PUBLICATIONS

English translation of International Preliminary Report on Patentability issued Mar. 4, 2010 in corresponding International (PCT) Application No. PCT/JP2008/002123.

Supplementary European Search Report issued Aug. 17, 2011 in corresponding European Application No. EP 08 79 0387.

Garnier et al., "Vertical device architecture by molding of organic-based thin film transistor", Applied Physics Letters, AIP, American Institute of Physics, vol. 73, No. 12, Sep. 21, 1998, pp. 1721-1723, XP012021001.

Chinese Office Action dated Dec. 31, 2010 issued in corresponding Chinese Application No. 200880101816.6 (with partial English translation).

* cited by examiner (a)

(b)

(c)

(a)

(b)

(c)

(a)

(b)

(a)

(b)

(c)

(a)

(b)

(c)

(d)

TRANSISTOR HAVING AN ORGANIC SEMICONDUCTOR WITH A HOLLOW SPACE

FIELD OF THE INVENTION

The present invention relates to a semiconductor device that has an organic semiconductor, a method for manufacturing the semiconductor device and an image display apparatus equipped with the semiconductor device, and particularly to a semiconductor device that has an organic semiconductor formed on a resin film, a method for manufacturing the semiconductor device and an image display apparatus equipped with the semiconductor device.

DESCRIPTION OF THE RELATED ART

As the number of information terminals in use increases, the need for flat panel displays of lighter weight to be used in computers has grown. The proliferation of information technologies has also increased the opportunities of handling information, which has previously been conveyed by paper media, in the form of electronic information. This trend has increased the needs for electronic paper or digital paper for mobile display medium that is thin and light weight and can be easily carried (JP 2007-67263A, etc.).

In a flat panel display apparatus in general, a display medium is formed by using elements based on liquid crystal, organic EL (electro-luminescence), electrophoresis or the like. Such a display medium chiefly employs active drive elements (TFT elements) as the picture drive elements, in order to ensure the uniformity of screen brightness, screen refreshing rate and other performance. In an ordinary computer display, for example, the TFT elements are formed on a glass substrate, and liquid crystal or organic EL elements are sealed therein.

As the TFT element, a Si semiconductor such as a-Si (amorphous silicon), p-Si (polycrystalline silicon) or the like is mainly used. The Si semiconductor (together with a metal layer as required) is formed in a plurality of layers so as to form source, drain and gate electrodes successively on the substrate, thereby constituting the TFT element.

Formation of the TFT element from the Si semiconductor involves the following two problems.

First, it is necessary to form the layers by repeating the sputtering and other manufacturing steps in a vacuum system that requires a vacuum chamber, thus making the equipment cost and the running cost very expensive. For example, forming each layer requires it to repetitively carry out vacuum vapor deposition, doping, photolithography, development of latent image and other steps, and the element is formed on the substrate through several dozens of steps. The semiconductor that is the critical part of switching operation is also formed by stacking semiconductor layers of a plurality of kinds such as p type and n type. With such a conventional manufacturing method that uses the Si semiconductor, it is difficult to change the production facilities so as to manufacture larger display screens, because this requires a significant design change of the production facilities such as vacuum chamber.

Second, materials to be used for the substrate are limited to heat resistant ones, and materials such as resin film that are light in weight and have flexibility cannot be used as the substrate.

The process of forming the TFT element from Si includes heating to a temperature as high as 500 to 1000° C. Therefore, the substrate must be formed from a material that endures such a high temperature, which is practically limited to glass. As a result, when a thin display such as electronic paper or digital paper is made by using TFT elements based on Si semiconductor, use of the glass substrate makes the display heavy and hard without flexibility, and thus it is easily broken when dropped. Namely, it is difficult to meet the needs for portable and slim display with a display apparatus constituted by forming TFT elements on a glass substrate.

A semiconductor material that has been vigorously researched in recent years as a promising candidate for solving the problems described above is the organic semiconductor material. The organic semiconductor is an organic compound that has high charge transport properties, and is applicable to an organic laser oscillating element and an organic thin film transistor (organic TFT) as well as the charge transporting material of an organic EL element.

A semiconductor device (organic semiconductor device) based on an organic semiconductor can be made in a process of a relatively low temperature, and therefore allows for a more tolerant requirement of heat resistance on the substrate, so that the TFT elements can be formed on a flexible substrate such as transparent resin substrate. An organic semiconductor having the form of solution can also be made by properly modifying the molecular structure. When the organic semiconductor solution is used as an ink in a printing process based on ink jet method, it is made possible to manufacture the semiconductor device under the condition that does not require vacuum such as in inactive gas atmosphere.

Electronics technology based on a printing process makes it possible to carry out the process at a lower temperature (not using high temperature), mitigate the vacuum process (in addition to the advantage of not using vacuum) and carry out the process without photolithography (not using photolithography).

FIG. 15 is a sectional view schematically showing the structure of a semiconductor device (flexible semiconductor device) 1000 that includes an organic semiconductor 130 manufactured by using the printing process. The semiconductor device 1000 has such a structure as layers (120, 130, 140, 150) are formed by printing on a resin substrate (such as PET or PI) 110. In the structure illustrated, a wiring layer 120, an organic semiconductor layer 130, an insulating film 140 and a wiring layer 150 are formed successively on the resin substrate 110. While the specific structure may be altered as required, a source electrode 120s, a drain electrode 120d and a gate electrode 150g are disposed around the organic semiconductor layer 130, thereby forming the organic TFT.

The display that is lighter in weight than the conventional displays and has flexibility so as not to break (or very unlikely to break) when dropped can be made as described above, by forming the TFT elements that drive the display material on the transparent resin substrate.

There are demands for thin displays such as electronic paper or digital paper that are further more compact and lighter in weight. To meet the demands, it is necessary to form the semiconductor elements with higher density in the semiconductor device 1000.

Similarly, there are also strong demands for stationary image display apparatuses based on liquid crystal or organic EL that are larger in screen size but are smaller in weight and depth, and for higher definition (higher resolution) to be achieved by forming more pixels in a given area. It is necessary to form the semiconductor elements with higher density in the semiconductor device 1000 also for the purpose of meeting these demands.

However, since the semiconductor device 1000 has such a structure as flat layers (120, 130, 140, 150) are formed one after another on the resin substrate 110, there is a limitation on the improvement of density of semiconductor elements that can be formed.

SUMMARY OF THE INVENTION

An object of the present invention is to provide a semiconductor device having semiconductor elements packed with a higher density by forming the semiconductor elements inside of a resin film substrate, and a method for manufacturing the same. Another object of the present invention is to provide an image forming apparatus that employs the semiconductor device having the semiconductor elements formed inside the resin film substrate.

A first aspect of the present invention is a semiconductor device comprising a resin film that has a through hole that penetrates from one surface to the other surface thereof, a source electrode disposed along the inner wall of the through hole, a drain electrode disposed along the inner wall of the through hole, a gate electrode disposed on the other surface of the resin film opposing the through hole, an insulating layer disposed on the gate electrode at the bottom of the through hole and an organic semiconductor disposed in the through hole so as to contact the source electrode and the drain electrode, wherein the organic semiconductor makes contact with at least a part of the insulating layer at the bottom of the through hole so that a channel is formed in the organic semiconductor in the vicinity of the insulating layer that is in contact therewith.

A second aspect of the present invention is the semiconductor device according to the first aspect, further comprising a second resin film that is bonded to the other surface of the resin film.

A third aspect of the present invention is the semiconductor device according to the second aspect, wherein the second resin film has a second through hole and a via conductor formed from an electrically conductive composite material in the second through hole.

A fourth aspect of the present invention is the semiconductor device according to any one of the first to third aspects, wherein the source electrode has a source electrode extension that extends over the insulating layer, the drain electrode has a drain electrode extension that extends over the insulating layer, and the organic semiconductor contacts the insulating layer between the source electrode extension and the drain electrode extension.

A fifth aspect of the present invention is the semiconductor device according to the fourth aspect, wherein the source electrode extension and the drain electrode extension have comb shape and are disposed to oppose each other at a distance so as to mesh with each other.

A sixth aspect of the present invention is the semiconductor device according to any one of the first to fifth aspects, wherein the insulating layer is formed so as to extend from the bottom of the through hole and cover the inner wall of the through hole so that the source electrode and the drain electrode are formed along the inner wall of the through hole via the insulating layer.

A seventh aspect of the present invention is the semiconductor device according to any one of the first to sixth aspects, wherein the organic semiconductor has a hollow space.

An eighth aspect of the present invention is the semiconductor device according to the seventh aspect, wherein the hollow space of the organic semiconductor is filled with an insulating material.

A ninth aspect of the present invention is the semiconductor device according to any one of the first to eighth aspects, wherein the organic semiconductor is a high molecular organic semiconductor A tenth aspect of the present invention is the semiconductor device according to any one of the first to eighth aspects, wherein the organic semiconductor is a low molecular organic semiconductor.

An eleventh aspect of the present invention is the semiconductor device according to any one of the first to tenth aspects, wherein the resin film is formed from any one material selected from the group consisting of a polyimide resin, a polyamide resin, a polyethylene naphthalate resin and an aramid resin.

A twelfth aspect of the present invention is the semiconductor device according to any one of the first to eleventh aspects, wherein the source electrode and the drain electrode are formed from a noble metal.

A thirteenth aspect of the present invention is an image display apparatus comprising a display section that has an array of light emitting elements and a drive circuit layer that drives the light emitting elements used in the display section, wherein the drive circuit layer includes the semiconductor device according to any one of the first to twelfth aspects.

A fourteenth aspect of the present invention is the image display apparatus according to the thirteenth aspect, wherein the semiconductor element of the semiconductor device according to any one of the first to twelfth aspects is used as a ON/OFF switching transistor.

A fifteenth aspect of the present invention is the image display apparatus according to the thirteenth or fourteenth aspect, wherein the semiconductor element of the semiconductor device according to any one of the first to twelfth aspects is used as a driver transistor that drives the light emitting element to emit light.

A sixteenth aspect of the present invention is the image display apparatus according to any one of the thirteenth to fifteenth aspects, wherein the light emitting element is an organic electroluminescence element.

A seventeenth aspect of the present invention is a method for manufacturing a semiconductor device, which comprises: (1) a step of forming an insulating layer and a gate electrode that is disposed on the insulating layer on one surface of a resin film and forming a through hole that penetrates the resin film from the other surface thereof to the insulating layer, (2) a step of forming a source electrode and a drain electrode on the inner wall of the through hole, and (3) a step of disposing an organic semiconductor in the through hole so as to make contact with the source electrode, the drain electrode and the insulating layer, wherein the source electrode and the drain electrode are disposed so that the organic semiconductor forms a channel in the vicinity of an area of contact with the insulating layer.

An eighteenth aspect of the present invention is the method for manufacturing a semiconductor device according to the seventeenth aspect, wherein the step (1) includes a step of disposing the one surface of the resin film on a second resin film that has a gate electrode disposed on the surface thereof and an insulating layer disposed on the gate electrode.

A nineteenth aspect of the present invention is the method for manufacturing a semiconductor device according to the eighteenth aspect, wherein the through hole of the step (1) is formed by disposing a resin film that has the through hole formed therein in advance on the insulating layer of the second resin film.

A twentieth aspect of the present invention is the method for manufacturing a semiconductor device according to any one of the seventeenth to nineteenth aspects, wherein the step (2) includes a step of providing the source electrode with a source electrode extension that extends over the insulating layer, and providing the drain electrode with a drain electrode extension that extends over the insulating layer, so as to bring the organic semiconductor and the insulating layer into contact with each other between the source electrode extension and the drain electrode extension.

A twenty-first aspect of the present invention is a method for manufacturing a semiconductor device, which comprises: (1) a step of forming a gate electrode on one surface of a resin film and forming a through hole that penetrates the resin film from the other surface thereof to the gate electrode, (2) a step of providing an insulating layer on the inner wall of the through hole and the gate electrode exposed from the through hole; (3) a step of forming a source electrode and a drain electrode on the insulating layer along the inner wall of the through hole; and (4) a step of disposing an organic semiconductor in the through hole so as to make contact with the gate electrode, the drain electrode and the insulating layer on the gate electrode, wherein the source electrode and the drain electrode are disposed so that the organic semiconductor forms a channel in the vicinity of the area of contact with the insulating layer on the gate electrode.

A twenty-second aspect of the present invention is the method for manufacturing a semiconductor device according to the twenty-first aspect, wherein the step (1) includes a step of disposing one surface of the resin film on a second resin film that has a gate electrode disposed on the surface thereof.

A twenty-third aspect of the present invention is the method for manufacturing a semiconductor device according to the twenty-second aspect, wherein the through hole of the step (1) is formed by disposing a resin film that has the through hole formed therein in advance on the gate electrode of the second resin film.

A twenty-fourth aspect of the present invention is the method for manufacturing a semiconductor device according to any one of the twenty-first to twenty-third aspects, wherein the step (3) includes a step of providing the source electrode with a source electrode extension that extends over the insulating layer on the gate electrode, and providing the drain electrode with a drain electrode extension that extends over the insulating layer on the gate electrode, so as to bring the organic semiconductor and the insulating layer that on the gate electrode into contact with each other between the source electrode extension and the drain electrode extension.

It is made possible to provide a semiconductor device of high-density integration and a method for manufacturing the same, by using the semiconductor device that has the semiconductor element including the source electrode, the drain electrode and the organic semiconductor which are disposed within the through hole provided in the resin film.

Since the resin film has pliability (or flexibility) and the semiconductor element can be formed therein, the semiconductor device having pliability (flexible semiconductor device) can be made.

Use of the semiconductor device also makes it possible to provide an image display apparatus that is smaller in size such as depth and lighter in weight and has pliability.

DETAILED DESCRIPTION OF THE INVENTION

Figure 1:
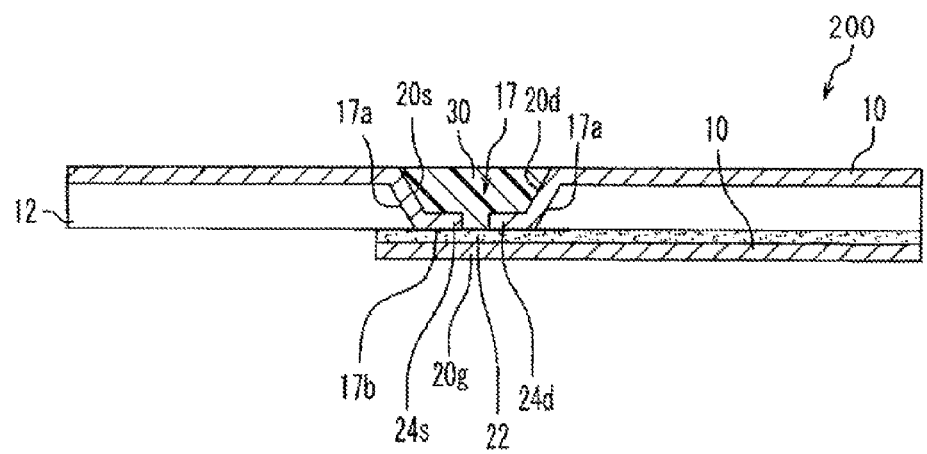
FIG. 1 is a sectional view schematically showing the constitution of a semiconductor device 200 according to a first embodiment of the present invention.

Embodiments of the present invention will be described in detail below with reference to the accompanying drawings. In the description that follows, terms that indicate particular direction or position (such as upper, lower, right, left and other phrases including thereof) will be used as required, which is for the purpose of making it easier to understand the present invention with reference to the attached drawings. These terms are not intended to restrict the scope of the present invention. Identical reference numeral used in different drawings means the identical part or member.

First Embodiment

FIG. 1 is a partial sectional view schematically showing the constitution of a semiconductor device 200 according to the first embodiment of the present invention. The semiconductor device 200 has an organic semiconductor section 30 provided in a through hole 17. Namely, the semiconductor device 200 has a resin film (flexible substrate) 12 that has the through hole 17 formed therein, while a source electrode 20s and a drain electrode 20d that are formed on the wall surface (inner wall) 17a and the organic semiconductor section 30 are provided in the through hole 17. The resin film 12 has, on one surface thereof, an electrically conductive layer 10 that is electrically connected to the source electrode 20s or the drain electrode 20d. The semiconductor device 200 has, on the other surface thereof, an insulating layer 22 provided so as to plug the through hole 17, while the insulating layer 22 serves as a gate insulating film. In this specification, the surface of the insulating layer 22 that faces the through hole 17 will be referred to as bottom surface 17b of the through hole 17. Provided on the insulating layer 22 is gate electrode 20g and the electrically conductive layer 10 that is electrically connected to the gate electrode 20g. The organic semiconductor section 30 makes contact with the source electrode 20s and the drain electrode 20d, and contact with the insulating layer 22 in the area where the source electrode 20s and the drain electrode 20d are separated from each other.

With the constitution described above, the semiconductor device 200 has the semiconductor element (FET), that is constituted from the organic semiconductor section 30, the source electrode 20s, the drain electrode 20d, the insulating layer (gate insulating layer) 22 and the gate electrode 20g, formed therein.

In the embodiment shown in FIG. 1, the source electrode 20s has an extension 24s that makes contact with the insulating layer 22 on the bottom surface 17b of the through hole 17, and the drain electrode 20d has an extension 24d that makes contact with the insulating layer 22 on the bottom surface 17b.

The source electrode 20s and the drain electrode 20d are separated from each other so that the organic semiconductor section 30 forms a channel (either p channel or n channel) in the vicinity of the area of contact with the gate insulating layer 22. The channel refers to the path of current (or carrier) flow in a field effect transistor.

In the embodiment shown in FIG. 1, the source electrode 20s is formed on substantially a half of the circumference (left half in FIG. 1) of the inner wall 17a of the through hole 17 and on substantially a half of the bottom surface (left half in FIG. 1), and the source electrode 20s is formed on the opposite half of the circumference (right half in FIG. 1) of the inner wall 17a and on the opposite half of the bottom surface (left half in FIG. 1), while the source electrode 20s and the drain electrode 20d are disposed at a predetermined distance from each other.

Even in case the extensions 24s, 24d are not provided, a channel is formed, for example, in a part of the organic semiconductor that makes contact with the gate insulating film 22 between the source electrode 20s and the drain electrode 20d. In this case, too, such a constitution may be employed as, for example, the source electrode 20s is formed on substantially a half of the circumference (left half in FIG. 1) of the inner wall 17a of the through hole 17 and the source electrode 20d is formed on the opposite half of the circumference (right half in FIG. 1) of the inner wall 17a.

Thus the semiconductor elements such as TFT are formed in the through hole 17 of the substrate (resin film) 12 on which semiconductor element (organic semiconductor element) has never been formed in the conventional art, by disposing the organic semiconductor section 30, the source electrode 20s and the gate electrode 20g. As a result, since space for the semiconductor device 200 can be efficiently utilized three-dimensionally, the semiconductor elements can be formed with a higher density.

Figure 2:
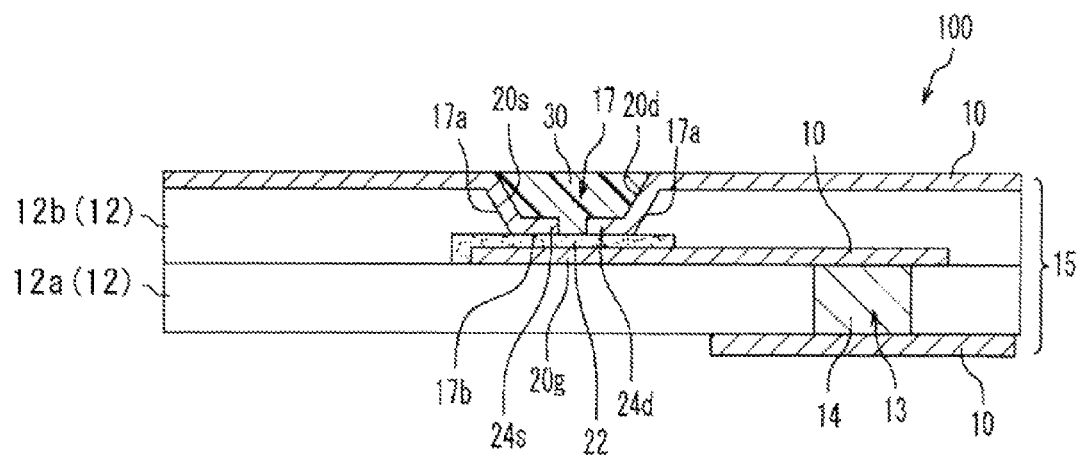
FIG. 2 is a sectional view schematically showing the constitution of a semiconductor device 100 according to the first embodiment of the present invention.

FIG. 2 is a sectional view schematically showing another semiconductor device 100 within the scope of this embodiment. The semiconductor device 100, similarly to the semiconductor device 200, has the resin film 12 (12b) that has the through hole 17 formed therein, and the semiconductor element (FET) is constituted from the organic semiconductor section 30, the source electrode 20s, the drain electrode 20d, the insulating layer (gate insulating layer) 22 and the gate electrode 20g. The resin film 12b has, formed on both surfaces thereof, the electrically conductive layer 10 that is electrically connected to the source electrode 20s, the drain electrode 20d or the gate electrode 20g.

The semiconductor device 100, unlike the semiconductor device 200, further comprises a second resin film 12a (12). The resin film 12a is disposed above the surface of the resin film 12 (12b) whereon the insulating layer 22 is provided, and has the insulating layer 22, the gate electrode 20g and the electrically conductive layer 10 that is electrically connected to the gate electrode 20g, which are sandwiched by the resin film 12a and the resin film 12b.

The resin film 12a has the through hole (via hole) 13 that has an interlayer connection member (via conductor) 14 disposed therein. The resin film 12a also has, on the other surface thereof (the surface that does not contact the gate electrode 20g), the electrically conductive layer 10 that is electrically connected with the gate electrode 20g thorough the via 13 and the electrically conductive layer 10 disposed between the resin film 12a and the resin film 12b.

The semiconductor device 100 has, as described above, three electrically conductive layers 10 (i.e. the electrically conductive layer 10 on one surface of the resin film 12b, the electrically conductive layer 10 disposed between the resin film 12a and the resin film 12b, and the electrically conductive layer 10 on the other surface of the resin film 12a) and the multilayer substrate 15 that comprises two resin films, namely the resin film 12a and the resin film 12b.

The semiconductor device 100 constituted as described above has such an advantage as, in addition to the benefit that the space can be efficiently utilized three-dimensionally, wiring can also be done three-dimensionally by means of the multilayer substrate 15 so that complicated wiring can be provided within a smaller space.

The operating principle of the semiconductor devices 100 and 200 will be described below.

When a voltage is applied to the gate electrode 20g of the semiconductor device 100, 200, carriers of the electric charge that is repelled by the polarity of the applied voltage within the organic semiconductor section 30 are repelled from the vicinity of the gate electrode (a depleted layer is created). Furthermore, when a voltage higher than a certain level is applied, carriers of the electric charge that is attracted by the polarity of the voltage applied to the gate electrode 20g are induced into the interface between the insulating layer (gate insulating film) 22 and the organic semiconductor section 30, and are accumulated therein. When a voltage is applied between the source electrode 20s and the drain electrode 20d under this condition, the carriers accumulated in the interface are driven by the electric field generated between the source electrode and the drain electrode so as to be absorbed by the drain, thereby generating a current flowing between the source electrode and the drain electrode.

When the amount of the carriers accumulated in the interface is modulated by controlling the voltage that is applied to the gate electrode 20, the current flowing between the drain electrode 20d and the source electrode 20s can be varied so as to enable, for example, switching operation.

The components of the semiconductor devices 100 and 200 will be described in detail below.

The resin film 12 (12a, 12b) is formed, for example, from a polyimide resin (PI), a polyamide resin (PA), a polyethylene naphthalate resin (PEN) or an aramid resin. These resin materials have excellent properties of heat resistance, dimensional stability and preventing gas permeation, and are preferably used as the material to form the flexible substrate (resin film) 12 of the semiconductor device 100, 200. The resin film 12 has thickness in a range, for example, from 1 to 38 µm.

The through hole 17 formed in the resin film 12 has truncated conical shape (round cross section parallel to the surface of the resin film 12 and trapezoidal cross section perpendicular to the surface of the resin film) formed by, for example, laser machining. In the embodiment shown in FIG. 1 and FIG. 2, cross sectional area of the through hole 17 is greater on the side of the upper surface (where the insulating film 22 is not provided) of the resin film 12 (12b) than on the side of the lower surface (where the insulating film 22 is provided) of the resin film 12 (12b), thus forming a shape flaring upward. This configuration makes the operation easier when forming the source electrode 20s and the drain electrode 20d by using laser beam to cut a metal layer formed by plating on the inner surface of the through hole 17 as will be described later.

The diameter of the through hole 17 is, for example, from 1 to 300 µm on the side of the upper surface (diameter of opening on the upper surface) of the resin film 12 (12b) where the cross sectional area is larger. In case the source electrode 20s and the drain electrode 20d do not have the extensions 24s, 24d, respectively, changing the diameter of the through hole 17, the diameter of the bottom surface 12b of the through hole 17 in particular, means changing the channel length and channel width between the source electrode 20s and the drain electrode 20d (when the inner wall 17b is substantially covered by the source electrode 20s and the drain electrode 20d). Therefore, in case the source electrode 20s and the drain electrode 20d do not have the extensions 24s, 24d, respectively, the diameter of the through hole 17, particularly the diameter of the bottom surface 17b, may be set so as to obtain the desired current capacity.

In case one semiconductor device comprises a plurality of semiconductor elements, it is not necessary to equalize the cross sectional areas of the through holes 17 of the semiconductor elements which may be different from each other. In case the semiconductor device 100 comprises two semiconductor elements, for example a switching transistor and a drive transistor, transistors having different characteristics can be easily formed by forming the semiconductor elements with the through holes 17 that have different cross sectional areas (areas of openings).

The through hole 17 is not limited to the truncated conical shape described above, and may be formed in various shapes such as cylinder.

While the through hole (via hole) 13 of the semiconductor device 100 has cylindrical shape in the embodiment shown in FIG. 2, it is not limited to this shape, and may be formed in various shapes such as truncated cone. The interlayer connection member 14 that fills the through hole 13 is formed from an electrically conductive material such as electrically conductive resin paste.

The through hole 17 has, on the inner wall 17a thereof, the source electrode 20s and the drain electrode 20d formed from a metal layer. The metal layer is formed by, for example, copper plating with a thickness in a range from 0.1 to 18 µm. The source electrode 20s and the drain electrode 20d may also be formed from a noble metal (such as Au), with a thickness in a range from 0.02 to 3 µm. The source electrode 20s and the drain electrode 20d formed from a metal other than a noble metal such as copper may also be plated with a noble metal (such as Au) on the surface thereof that makes contact with the organic semiconductor section 30.

The source electrode 20s and the drain electrode 20d may also be formed, beside the material described above, from a material selected from the group consisting of chromium (Cr), titanium (Ti), aluminum (Al), molybdenum (Mo), tungsten (W), nickel (Ni), palladium (Pd), platinum (Pt), silver (Ag), tin (Sn), electricity conducting polyaniline, electricity conducting polypyrrole, electricity conducting polythiazyl and electricity conducting polymer, and combinations thereof. The source electrode 20s and the drain electrode 20d may also be constituted from a bilayer electrode of an Au layer and a Cr layer, or a bilayer electrode of an Au layer and a Pt layer.

In the embodiment shown in FIG. 1 and FIG. 2, the source electrode 20s has the extension 24s that extends over the insulating layer 22, and the drain electrode 20d has the extension 24d that extends over the insulating layer 22. The source electrode 20s and the drain electrode 20d can function without one or both of the extension 24s and the extension 24d.

In a structure that does not have both the extension 24s and the extension 24d, for example, a channel is formed in a part of the organic semiconductor section 30 that is disposed right above the entire bottom surface 17b of the through hole.

However, providing the extensions 24s, 24d makes it possible to decrease the channel length (distance between the source and the drain) and the channel is formed in the organic semiconductor section 30 located between the source and the drain. Thus it is preferable that the source electrode 20s and the drain electrode 20d have the extensions 24s, 24d, respectively, so that an FET having a short channel can be formed.

The gate electrode 20g and the electrically conductive layer 10 of this embodiment may be formed from a material selected from the group consisting of chromium (Cr), titanium (Ti), copper (Cu), aluminum (Al), molybdenum (Mo), tungsten (W) nickel (Ni), gold (Au), palladium (Pd), platinum (Pt), silver (Ag), tin (Sn), electricity conducting polyaniline, electricity conducting polypyrrole, electricity conducting polythiazyl and electricity conducting polymer, and combinations thereof.

The insulating layer (gate insulating film) 22 is formed from PVA (polyvinyl alcohol), PVP (poly-4-vinylphenol), BCB (benzocyclobutene) or $SiO_2$ formed by applying polysilazane. The insulating layer (gate insulating film) 22 may also be formed from an epoxy resin. The thickness of the gate insulating layer (gate insulating film) 22 is, for example, from 50 to 300 nm.

The organic semiconductor section 30 fills the inside of the through hole 17, and is disposed so as to make ohmic contact with the source electrode 20s and the drain electrode 20d, and contact with the gate insulating film 22. In case the source electrode 20s and the drain electrode 20d have the extensions 24s, 24d, respectively, as in this embodiment, the extension 24s and the extension 24d make ohmic contact with the organic semiconductor section 30 on the surfaces thereof where these members oppose each other.

Various materials may be used for the organic semiconductor material that constitutes the organic semiconductor section 30. An organic semiconductor material that has high mobility is preferably used, such as pentacene. Organic semiconductor materials are roughly classified into high molecular materials (such as polythiophene or a derivative thereof), low molecular materials (such as pentacene or solubilized pentacene), nano-carbon materials (such as carbon nanotube, SiGe nanowire, fullerene, modified fullerene), inorganic-organic composite materials (such as a composite material constituted from $C_6H_5C_2H_4NH_3$ and $SnI_4$), all of which can be used as the organic semiconductor section 30. Other examples of the organic semiconductor material will be further described later.

In the semiconductor devices 100 and 200, as described above, the gate electrode 20g, the source electrode 20s and the drain electrode 20d can all be formed from metal foil such as plating.

This means that it is made possible to solve the problems described below that arise when the wiring layers 120, 150 that include the gate electrode, the source electrode and the drain electrode are formed by a printing process such as ink jet printing in the semiconductor device 1000 of the conventional art.

The semiconductor device 1000 of the conventional art has such problems that a sintering temperature as high as 600 to 1,000° C. that inhibits the use of resin film substrate is required, for forming the wiring layers from ordinary metal particles, and that ink jet nozzles may be clogged. Accordingly, the wiring is formed from a mixture of an ink solution and metal particles that have been made extremely small on the order of nanometers (nano-paste material).

However, the nano-paste material is very expensive. In addition, the wiring that is formed from the nano-paste material is formed by sintering metal particles on the order of nanometers, and therefore has a problem of high electrical resistance due to oxide film on the surface of the metal particles.

The semiconductor devices 100 and 200 of this embodiment do not require the use of nano-paste material, and therefore make it possible to form a wiring that includes the gate electrode, the source electrode and the drain electrode at a lower cost than in the case of the semiconductor device 1000 of the conventional art, and significantly decrease the electrical resistance.

Variations of the semiconductor device 100 will be described below.

Figure 3:
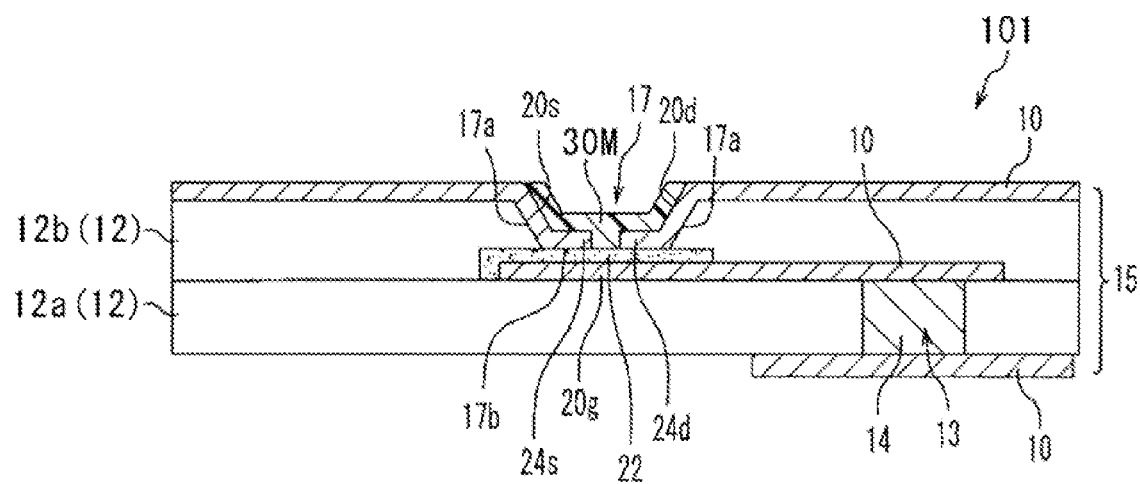
FIG. 3 is a sectional view schematically showing the constitution of a semiconductor device 101 according to the first embodiment of the present invention.
Figure 4:
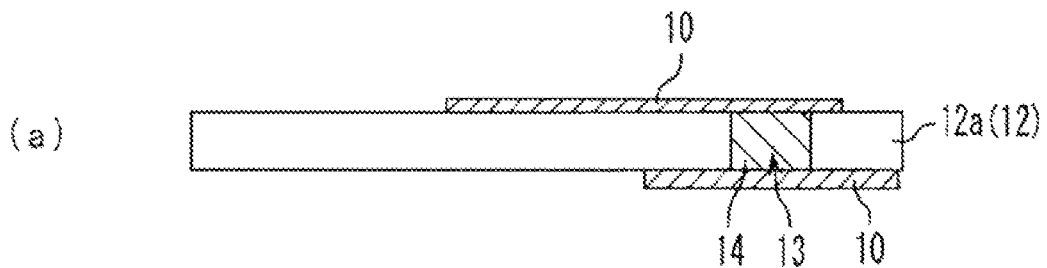
FIG. 4 is a sectional view showing a method for manufacturing a semiconductor device 100 according to the first embodiment of the present invention.
Figure 4:
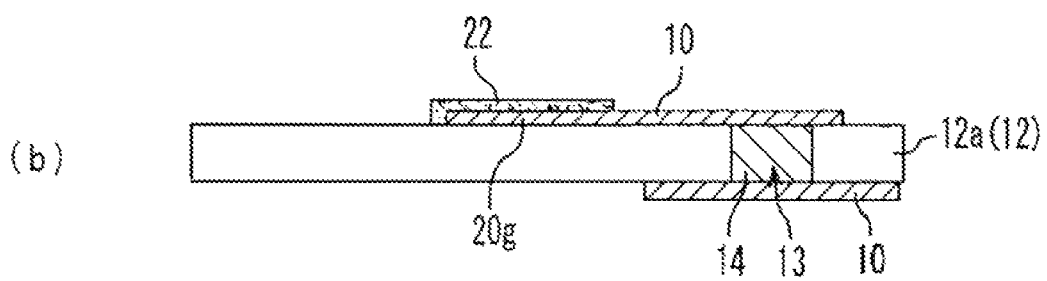
Figure 4:
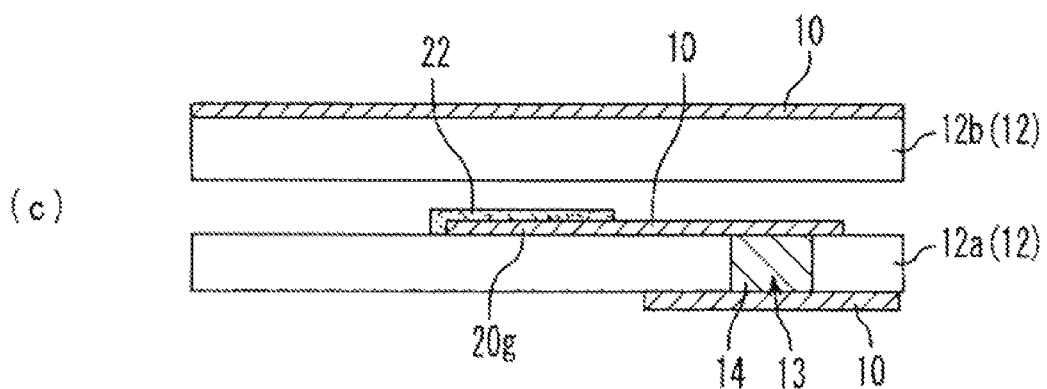
Figure 5:
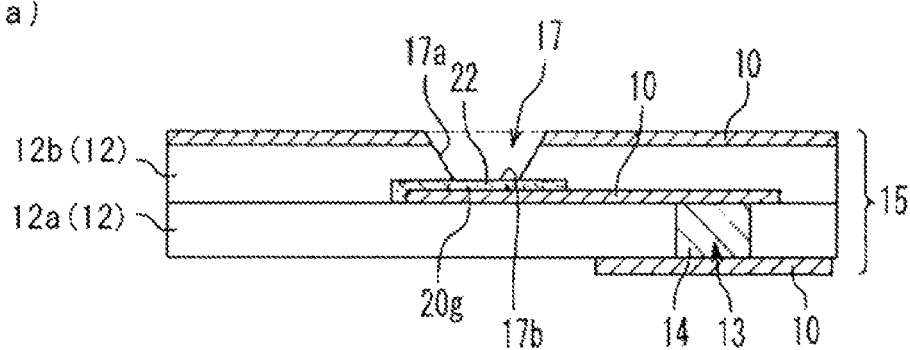
FIG. 5 is a sectional view showing a method for manufacturing a semiconductor device 100 according to the first embodiment of the present invention.
Figure 5:
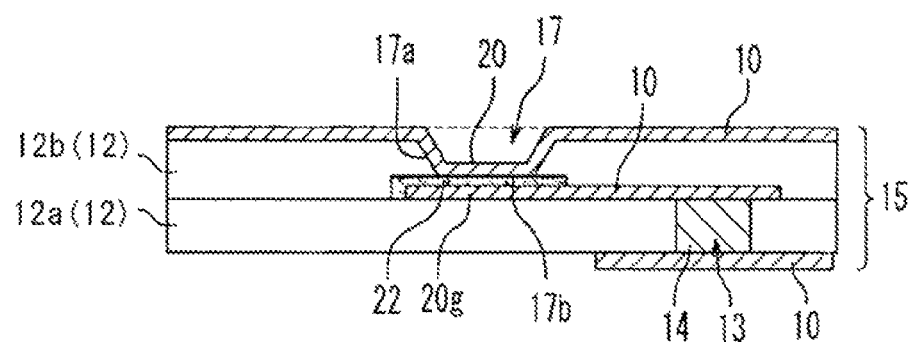
Figure 5:
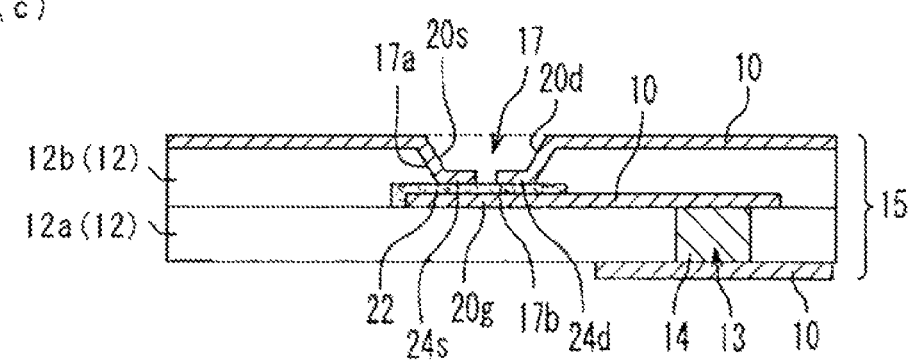

FIG. 3 is a sectional view showing a semiconductor device 101 that is a variation of the semiconductor device 100. An organic semiconductor section 30M of the semiconductor device 101 is provided along the inner wall 17a and the bottom surface 17b, and a hollow space surrounded by the organic semiconductor section 30M is formed. Such a hollow structure can be formed by, for example, coating the inside of the through hole 17 with a solvent that includes the organic semiconductor material dispersed therein, then removing (vaporizing) the solvent so as to leave the organic semiconductor material to remain on the inner wall 17a and the bottom surface 17b of the through hole 17 (on the insulating layer 22), the source electrode 20s and the drain electrode 20d. The hollow structure can be formed also by vapor deposition of the organic semiconductor material on the inner wall 17a and the bottom surface 17b of the through hole 17 (on the insulating layer 22), the source electrode 20s and the drain electrode 20d.

The semiconductor device 101 that has the hollow organic semiconductor section 30M has such advantages that the amount of organic semiconductor material used can be reduced, and that the hollow space can be filled with other material as required.

Such a remarkable effect can be achieved as enhancing the effect of preventing current leakage between the source electrode 20s and the drain electrode 20d by filling the organic semiconductor section 30M with an insulating material.

Also because the organic semiconductor section 30M is restricted from making contact with the atmosphere by filling the organic semiconductor section 30M with an insulating material, degradation of the organic semiconductor section 30M due to oxygen can be suppressed so that the semiconductor device having higher reliability can be provided.

This is because the organic semiconductor has lower mobility than those of inorganic semiconductor materials (such as polysilicon) and, moreover, the mobility may further decrease in the atmosphere or air or oxygen.

In the semiconductor device 101, the hollow space of the organic semiconductor section 30M is filled with an insulating material so that the organic semiconductor section 30M can be substantially surrounded on the outer circumference thereof by the insulating material, the inner wall 17a of the through hole 17, the source electrode 20s, the drain electrode 20d and the gate insulating film 22. As a result, the organic semiconductor section 30M can be restricted from making contact with oxygen (or air), so that chronic degradation of the organic semiconductor that constitutes the organic semiconductor section 30M can be suppressed or mitigated.

The method for manufacturing a semiconductor device 100 of the first embodiment will be described below with reference to FIG. 4(a) to FIG. 6.

Step 1

The resin film 12 (12a) having the electrically conductive layers 10 formed on both surfaces thereof is prepared as shown in FIG. 4(a). The resin film may be, for example, an aramid resin film having a thickness of 4 μm. Other resins may also be used such as a polyimide resin, a polyamide resin and a polyethylene naphthalate resin.

The electrically conductive layers 10 may be formed from a copper foil (having a thickness of, for example, 5 μm). The electrically conductive layers 10 may also be patterned. The resin film 12a has the interlayer connection member (via conductor) 14 that connects the electrically conductive layer 10 provided on the upper surface and the electrically conductive layer 10 provided on the lower surface. The interlayer connection member 14 is formed from, for example, an electrically conductive paste that fills in the via hole (through hole) 13.

Step 2

The gate insulating film 22 is formed on a part of the electrically conductive layer 10 provided on the upper surface of the resin film 12a, that is to become the gate electrode 20g as shown in FIG. 4(b). The gate insulating film 22 can be formed, for example, by applying the insulating material. The gate insulating film 22 may also be formed by electrodeposition coating method forming a electrodeposition coating film, spraying method using a spray coater or ink jet process.

Step 3

The lower surface of the resin film 12b having the electrically conductive layer (metal layer) 10 provided on the upper surface thereof and the upper surface of the resin film 12a having the gate insulating film 22 formed thereon are disposed to oppose each other as shown in FIG. 4(c). The lower surface of the resin film 12b and the upper surface of the resin film 12a are bonded so as to cover the gate insulating film 22. The multilayer resin substrate 15 is formed by bonding the resin film 12a and the resin film 12b in this way.

Step 4

The through hole 17 is formed in the resin film 12b so that the gate insulating film 22 is exposed as shown in FIG. 5(a). In the embodiment shown in FIG. 5(a), the through hole 17 is formed by irradiating with laser beam, although the through hole 17 may be formed by other method such as etching. Also in the embodiment shown in FIG. 5(a), the through hole 17 has round shape when viewed from above the resin film 12, but may also have other shape such as oval, elongated circle or rectangle.

Step 5

The metal layer 20 is formed by applying metal plating to the inner wall 17a of the through hole 17 and the gate insulating film 22 (the portion of the bottom surface 17b of the through hole 17) as shown in FIG. 5(b). The metal layer 20 is formed by, for example, copper plating. The metal layer 20 is formed so as to connect to the electrically conducting layer 10.

Step 6

A part of the metal layer 20 located on the bottom surface 17b of the through hole 17 is removed so as to divide the metal layer 20 and form the source electrode 20s and the drain electrode 20d as shown in FIG. 5(c). Removal of the metal layer 20 can be done by, for example, irradiating with laser beam.

Figure 7:
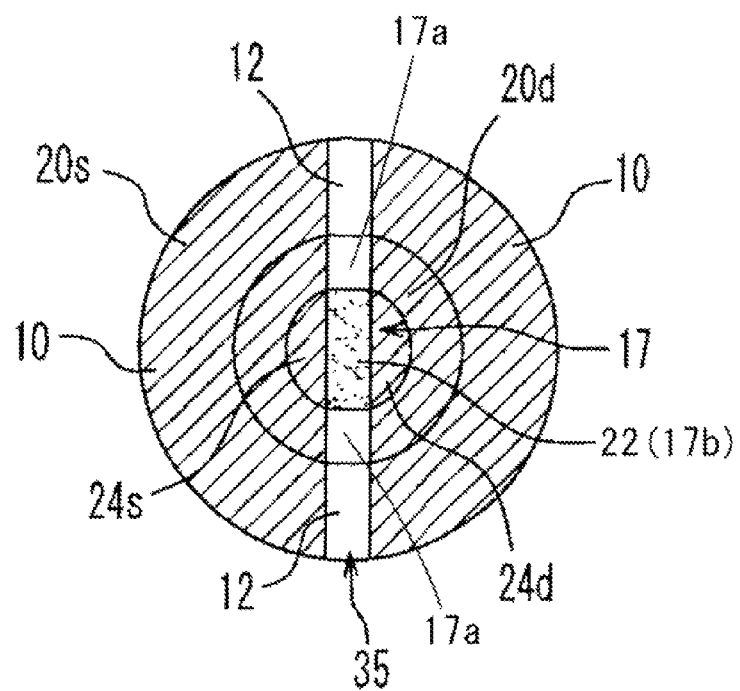
FIG. 7 is a top view schematically showing the constitution of a through hole and surrounding thereof in the semiconductor device 100 according to the first embodiment of the present invention.

FIG. 7 shows the inside and periphery of the through hole 17 after dividing the metal layer 20, viewed from above (in the direction normal to the resin film 12). The source electrode 20s (including the extension 24s) and the drain electrode 20d (including the extension 24d) are separated from each other by the gap (the portion without the metal layer 20) formed by removing the metal layer 20 by laser irradiation.

In FIG. 7 and FIG. 5(c), the source electrode 20s is formed to cover the substantially entire left half of the circumference of the inner wall 17a of the through hole 17 and the substantially entire left half of the bottom surface 17b and connect to the electrically conductive layer 10. Similarly, the drain electrode is formed to cover the substantially entire right half of the circumference of the inner wall 17a of the through hole 17 and the substantially entire right half of the bottom surface 17b and connect to the electrically conductive layer 10.

Step 7

Figure 6:
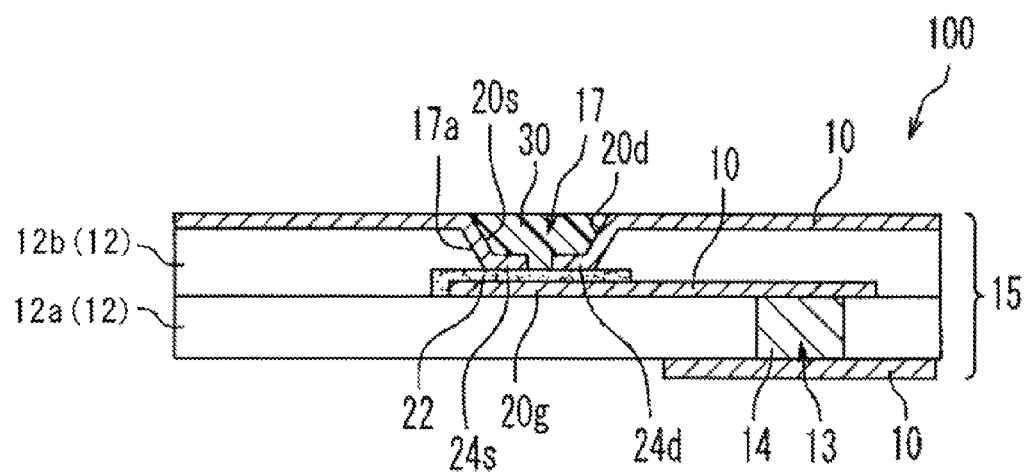
FIG. 6 is a sectional view showing a method for manufacturing a semiconductor device 100 according to the first embodiment of the present invention.

The through hole 17 is filled with a material that includes the organic semiconductor as shown in FIG. 6, so as to form the organic semiconductor section 30 in the through hole 17.

As the organic semiconductor material that constitutes the organic semiconductor section 30 of this embodiment, while partially overlapping with that described above, the following materials may be used: (1) an acene molecular material selected from the group consisting of naphthalene, anthracene, tetracene, pentacene, hexacene and derivatives thereof; (2) a pigment selected from the group consisting of a phthalocyanine compound, an azo compound and a perylene compound, and derivative thereof; (3) a low molecular compound selected from the group consisting of a hydrazone compound, a triphenylmethane compound, a diphenylmethane compound, a stilbene compound, an arylvinyl compound, a pyrazoline compound, a triphenylamine compound and a triarylamine compound, and derivative thereof; and (4) a high molecular compound selected from the group consisting of poly-N-vinylcarbazole, halogenated poly-N-vinylcarbazole, polyvinylpyrene, polyvinyl anthracene, a pyrene-formaldehyde resin and an ethylcarbazole formaldehyde resin. Alternatively, the organic semiconductor material may also be a fluorenone-based compound, a diphenoquinone-based compound, a benzoquinone-based compound, an indenone-based compound, a porphyrin-based compound, a polythiophene-based compound or a polyphenylene-based compound.

The organic semiconductor section 30 can be formed by printing. In this embodiment, since the organic semiconductor section 30 can be formed by filling the through hole 17 with a material that includes the organic semiconductor, position of the organic semiconductor section 30 is determined when the position is determined for forming the through hole 17, providing a great technical advantage. When the organic semiconductor section of the conventional art is formed by ink jet printing, it is necessary to maintain positioning accuracy of an ink jet ejecting tool and hold the ink that includes the organic semiconductor precisely at the predetermined positions by forming a bank or other member. According to this embodiment, however, once the through hole 17 is precisely positioned, the organic semiconductor section 30 can be formed according to the position.

In case the organic semiconductor material is a high molecular organic semiconductor (such as polythiophene or a derivative thereof), it is preferable to form the organic semiconductor section 30 by the printing process.

In case the organic semiconductor material is a low molecular organic semiconductor (such as pentacene), it is preferable to form the organic semiconductor section 30 by the vapor deposition process.

The semiconductor device 100 is made through the steps 1 to 7 described above.

The semiconductor device 200 can also be manufactured by a method similar to that described above. Specifically, instead of the steps 1 to 3, the resin film 12 having the electrically conductive layer 10 formed on one surface thereof and the insulating layer 22 shown in FIG. 1 and the electrically conductive layer 10 formed on the other surface is prepared. The through hole 17 is formed in the resin film 12 by the method shown in the step 4 so as to form the metal layer 20 by the method shown in the step 5, divide the metal layer 20 so as to form the source electrode 20s and the drain electrode 20d as shown in the step 6, and form the organic semiconductor section 30 thereby to make the semiconductor device 200 as shown in the step 7.

The advantages of the methods of manufacturing a semiconductor devices 100, 200 will be described below.

In the conventional art, total printing process is employed where the electrically conductive layer (wiring) may also be formed together with the organic semiconductor section, in which case wirings are often formed from metal nano-paste. However, the metal nano-paste is very expensive. In addition, the wiring that is formed from the metal nano-paste tends to have higher electrical resistance than a typical wiring formed from copper does. The method of this embodiment makes it possible to easily form the typical copper wiring without using the expensive nano-paste, and therefore offers high technical value.

There is also such an advantage that, since the source electrode 20s, the drain electrode 20d and the organic semiconductor section 30 are formed in the through hole 17, these components can be easily positioned with high accuracy.

As a result, the semiconductor devices 100, 200 are free from the problems described below, which are encountered in the semiconductor device 1000 of the conventional art where the layers are formed by ink jet printing method.

When the layers are formed by ink jet printing, it is necessary to hold the liquid material precisely at the predetermined positions by means of bank or other members so as to form the layers at the desired positions, resulting in problems related to the formation of the bank or other members and the positioning accuracy. In addition, there is such a problem that the organic device becomes thicker as flatness of the organic semiconductor device is maintained, since the layers such as the source electrode layer, the drain electrode layer, the organic semiconductor layer, the insulating layer and the gate electrode layer are stacked one on another on the substrate by ink jet printing process. Moreover, there is a problem of decreasing yield of production due to the accuracy of positioning operations, when forming the layers one on another by printing. The yield of production tends to decrease as the semiconductor device 1000 becomes larger in size.

When the semiconductor device 1000 is used in an image display apparatus such as organic EL display, in particular, the problem related to the printing process described above may be tolerated if the screen is small as in such a case as a cellular phone, although the problem of printing process becomes conspicuous if the screen is large (a large screen of 1 meter class).

However, since the through hole 17 can be formed in the semiconductor devices 100 and 200 easily at the desired position by means of laser or the like, the problem described above does not arise as the semiconductor element such as TFT can be accurately positioned with ease.

As a variation of the method for manufacturing the semiconductor device 100 described above, the following may be conceived.

After stacking the layers in the step 3, the metal layer (electrically conductive layer) 10 formed on the upper surface of the resin film 12b is put into contact with the gate insulating film 22 and the through hole 17 is formed, instead of the steps 4 and 5. As the conditions for forming the through hole are properly set, the electrically conductive layer 10 deforms during the process of forming the through hole 17, so as to extend along the inner wall 17a and the bottom surface 17b (top of the insulating layer) of the through hole 17.

Then a part of the metal layer 10 disposed on the insulating layer 22 is removed so that the gate insulating film 22 is exposed. Removal of part of the metal layer 10 can be done by means of laser, similarly to the process 6 described previously.

With this variation, the steps 4 and 5 can be replaced by the significantly simplified process described above.

In another variation of the method for manufacturing the semiconductor device 100, formation of the through hole 17 by means of laser in the step 4 can be omitted by forming the through hole 17 in advance in the resin film 12b that is used in the step 3. Moreover, this variation can be applied also for manufacturing of the semiconductor device 200, by forming the through hole 17 in advance in the resin film 12 having the electrically conductive layer 10 formed on one surface thereof and the insulating layer 22 and the electrically conductive layer 10 shown in FIG. 1 formed on the other surface.

Second Embodiment

A semiconductor device 102 of the second embodiment of the present invention will be described below with reference to FIG. 8.

Figure 8:
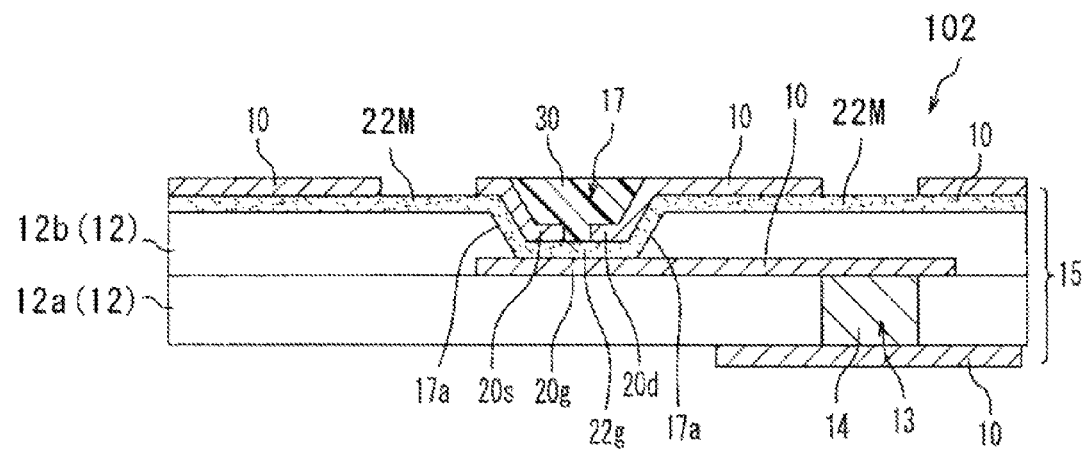
FIG. 8 is a sectional view schematically showing the constitution of a semiconductor device 102 according to a second embodiment of the present invention.

The semiconductor device 102 shown in FIG. 8 is different from the semiconductor device 100 in that an insulating layer 22M is formed continuously from the upper surface of the resin film 12b to the inner wall 17a and the bottom of the through hole 17, and a part of which functions as a gate insulating film. The insulating layer 22M may extend over the upper surface of the resin film 12b of the multiplayer wiring substrate 15 as in the embodiment shown in FIG. 8, although the present invention is not limited to this configuration.

Of the insulating layer 22M that extends over the upper surface of the resin film 12b, the inner wall 17a of the through hole 17 and the gate electrode 20g, the portion formed on the gate electrode 20g functions as a gate insulating film 22g.

The second embodiment is different from the semiconductor device 100 of the first embodiment in that portions of the source electrode 20s and the drain electrode 20d that are on the inner wall of the through hole 17 are formed on the insulating layer 22M.

In the embodiment shown in FIG. 8, the source electrode 20s and the drain electrode 20d have respective extensions on the gate insulating film (in parallel to the lower surface of the resin film 12b).

The semiconductor device 102 has such an advantage that the insulating layer 22M that includes the gate insulating film 22g can be formed after forming the through hole 17, as will be described in detail later.

A semiconductor device that has only one resin film 12 similarly to the semiconductor device 200 and accordingly does not have the via hole 13 in the constitution of the semiconductor device 102 is also within the scope of the present invention.

In the constitution of the semiconductor device 102, a hollow space surrounded by the organic semiconductor section 30 may be formed similarly to the semiconductor device 101.

The method for manufacturing a semiconductor device 102 of this embodiment will be described below with reference to FIG. 10(a) to FIG. 12(d). Description similar to that of the method for manufacturing the semiconductor device of the first embodiment will be omitted.

Step 1

The resin film 12a having the electrically conductive layers 10 formed on both surfaces thereof is prepared as shown in FIG. 10(a), similarly to FIG. 4(a).

Step 2

The resin film 12b is disposed above the resin film 12a so as to cover a portion 20g of the electrically conductive layer 10 provided on the upper surface of the resin film 12a, that is to become the gate electrode as shown in FIG. 10(b). Then the resin film 12a and the resin film 12b are bonded together to form the multilayer resin substrate 15. This stacking step (laminating step) may be carried out under conditions of 80° C. and pressure of 0.5 MPa for 2 minutes.

Step 3

The through hole 17 is formed in the resin film 12b of the multilayer resin substrate 15 so that the gate electrode 20g is exposed as shown in FIG. 10(c). In this embodiment, the through hole 17 having diameter of 300 μm (diameter in the upper surface of the resin film 12b) is formed by means of, for example, $CO_2$ laser.

Step 4

The insulating layer 22M is formed on the top surface of the resin film 12b that includes the inner wall 17a of the through hole 17, and the gate electrode 20g (the bottom surface of the through hole 17) as shown in FIG. 11(a). In this embodiment, a B stage resin (for example, an epoxy resin) is spin-coated over the entire upper surface of the resin film 12b, dried at 80° C., and then heat-treated at 200° C. to finish the thermal curing, so as to form the insulating layer 22M.

Step 5

The electrically conductive layer 10 is formed on the insulating layer 22M as shown in FIG. 11(b). In this case, the entire upper surface of the resin film 12b is plated with copper, and the electrically conductive layer 10 is formed on the insulating layer 22M.

Step 6

The source electrode 20s and the drain electrode 20d are formed from the electrically conductive layers 10 provided on the insulating layer 22 in the through hole 17 as shown in FIG. 11(c). In this embodiment, the source electrode 20s and the drain electrode 20d are separated from each other, for example, by removing a predetermined part of the electrically conductive layers 10 disposed in the through hole 17 by laser irradiation. A wiring layer electrically connected to the source electrode 20s and the drain electrode 20d is formed by etching the electrically conductive layer 10 provided on the upper surface of the resin film 12b into predetermined pattern.

Separation of the source electrode 20s and the drain electrode 20ds and patterning the electrically conductive layer 10 disposed on the upper surface of the resin film 12b may be carried out simultaneously by etching the predetermined portion of the electrically conductive layer 10 provided in the through hole 17a and the electrically conductive layer 10.

Step 7

The organic semiconductor section 30 is formed in the through hole 17 by introducing the organic semiconductor into the through hole 17 as shown in FIG. 11(d). The organic semiconductor section 30 may also be formed by applying the organic semiconductor dissolved in xylene into the through hole 17 by ink jet process, applying heat treatment (for example, at 200° C. for 30 minutes) so as to remove the solvent from the organic semiconductor by evaporation, and crystallizing the organic semiconductor. Thus the semiconductor device 102 shown in FIG. 8 is made.

In another variation of the method for manufacturing a semiconductor device 102, formation of the through hole 17 by means of laser in the step 3 can be omitted by forming the through hole 17 in advance in the resin film 12b that is used in the step 2.

Figure 9:
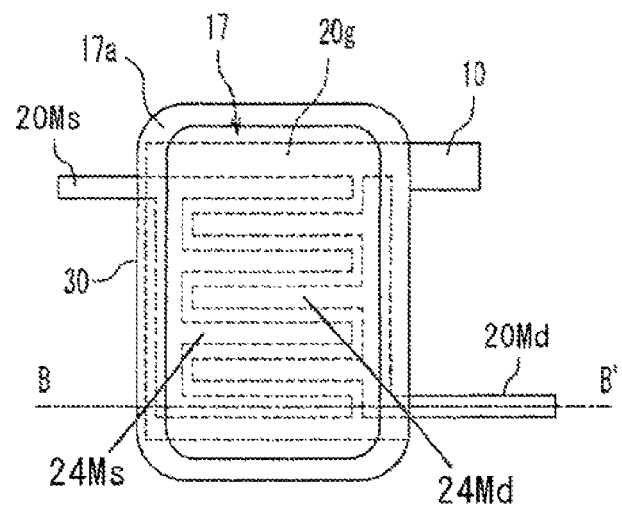
FIG. 9(a) is a top view schematically showing the structure in plan view of a source electrode 20Ms and a drain electrode 20Md of a semiconductor device 103 according to the second embodiment of the present invention.
FIG. 9(b) is a sectional view schematically showing the constitution of the semiconductor device 103 according to the second embodiment of the present invention taken along lines B-B' in FIG. 9.
Figure 9:
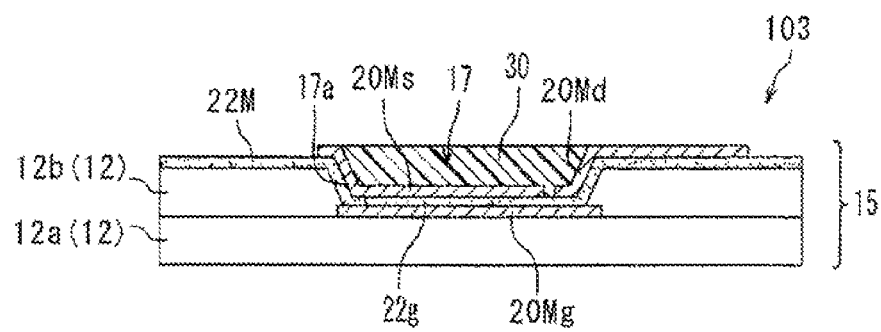
Figure 10:
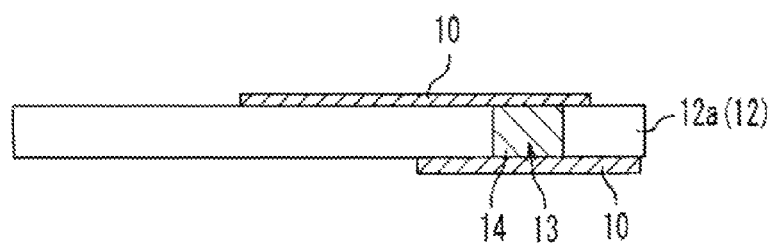
FIG. 10 is a sectional view showing a method for manufacturing a semiconductor device 102 according to the second embodiment of the present invention.
Figure 10:
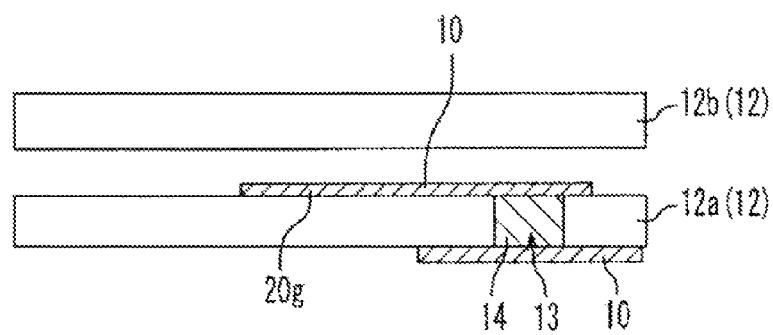
Figure 10:
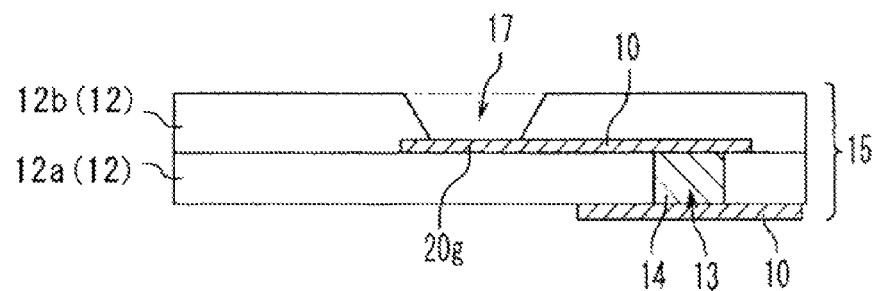
Figure 11:
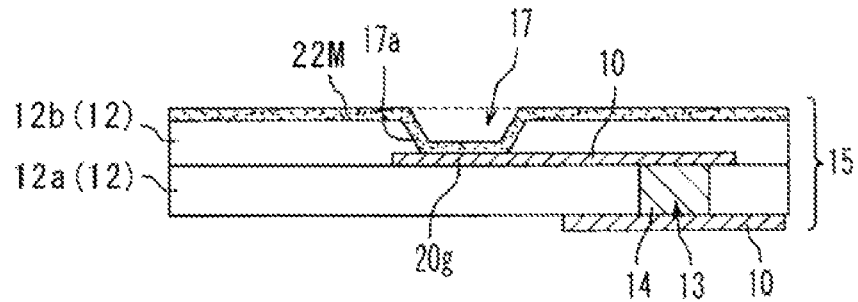
FIG. 11 is a sectional view showing a method for manufacturing a semiconductor device 102 according to the second embodiment of the present invention.
Figure 11:
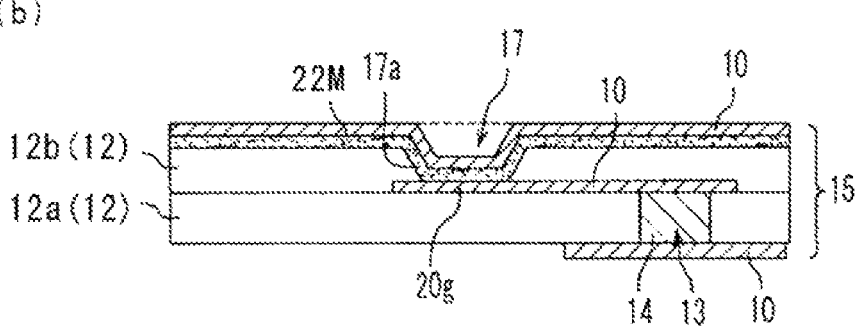
Figure 11:
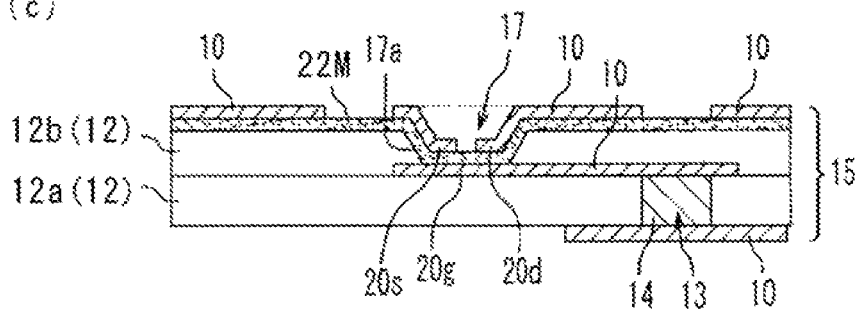
Figure 11:
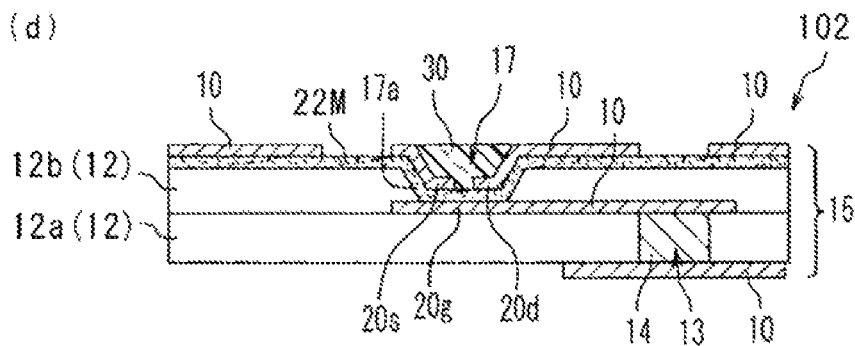

FIG. 9(a) and FIG. 9(b) show a semiconductor device 103 which is a variation of this embodiment (only a part of the semiconductor device 103 is shown in FIG. 9(a)). FIG. 9(a) is a top view showing the plan layout of a source electrode 20s and a drain electrode 20d within and in the vicinity of the through hole 17. FIG. 9(b) is a sectional view schematically showing the constitution of the semiconductor device 103 taken along lines B-B' in FIG. 9(a). In the semiconductor device 103, the source electrode 20Ms (extension 24Ms) and the drain electrode 20Md (extension 24Md) have comb shape and are disposed to oppose each other at a distance so as to mesh with each other, as shown in FIG. 9.

This variation is characterized in that the source electrode 20Ms and the drain electrode 20Md of comb shape are formed in a single through hole 17.

In the semiconductor device 103, the channel length (distance between the source electrode 20Ms and the drain electrode 20Md) is 10 μm and the channel width (length of the portion where the source electrode 20Ms and the drain electrode 20Md oppose each other, or length between comb-shaped electrodes) is 1,000 μm. That is, the channel width is 100 times the channel length in this case. Width of the comb section of the source electrode 20s and the drain electrode 20d is 25 μm, and line/space (L/S) is 25 μm/10 μm.

Forming the source electrode and the drain electrode in the comb shape makes it possible to greatly increase the channel width, thereby flowing a current large enough, for example, to drive the organic EL element between the source electrode 20Ms and the drain electrode 20Md.

Materials and other aspects of the constitution of the source electrode 20Ms and the drain electrode 20Md other than the shape are same as those of the source electrode 20s and the drain electrode 20d. The thickness of the gate electrode 20g is, for example, about 0.3 μm.

The source electrode 20Ms and the drain electrode 20Md that have the comb shape can be applied to any of the semiconductor devices described in the first embodiment.

Third Embodiment

Figure 12:
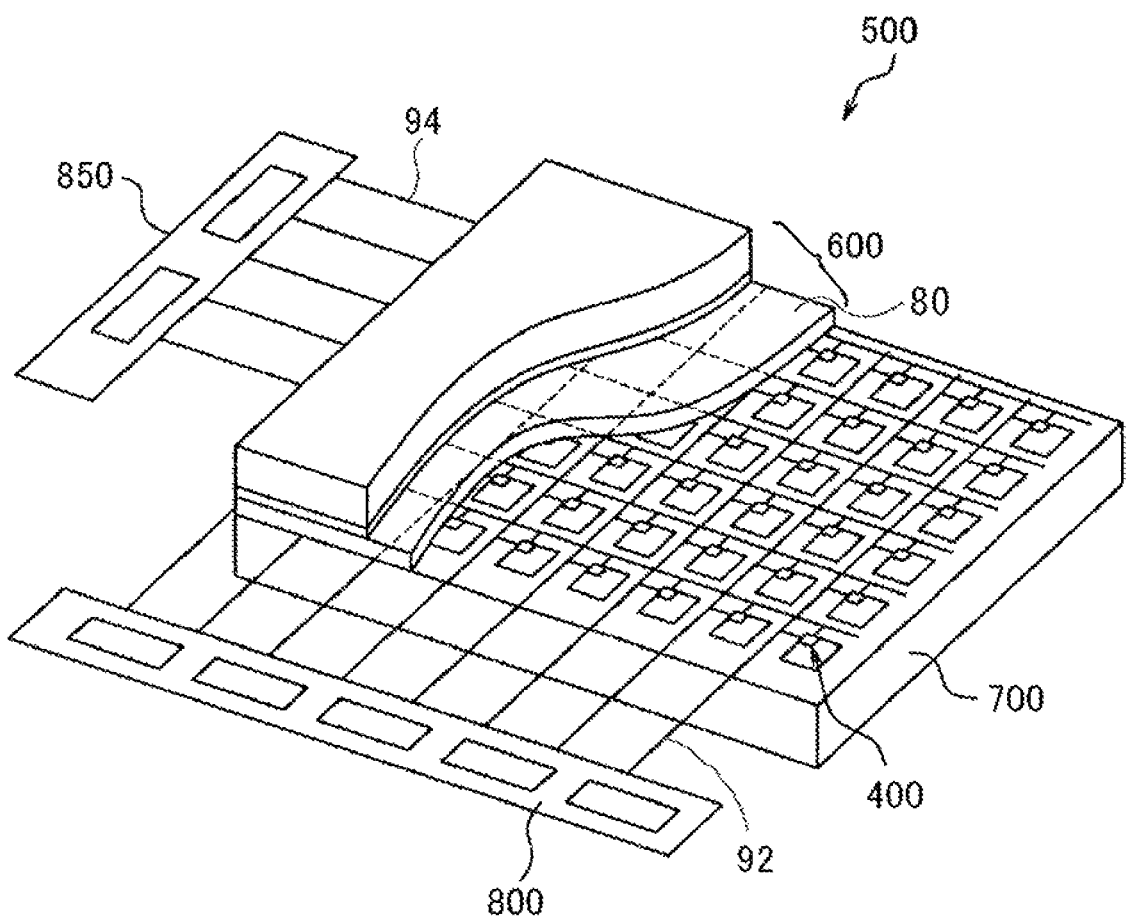
FIG. 12 is a perspective view schematically showing an image display apparatus 500 according to a third embodiment of the present invention.

FIG. 12 is a cutaway perspective view showing an image display apparatus (organic EL display apparatus) 500 according to the present invention. The image display apparatus 500 comprises a light emitting layer 600 consisting of a plurality of light emitting elements 80 disposed in an orderly arrangement, a drive circuit layer 700 consisting of a plurality of semiconductor devices 300 for driving (switching ON/OFF) the light emitting elements and driver sections 800, 850 that supply electric current via a data line 92 and a switching line 94 to the drive circuit layer 700.

Figure 13:
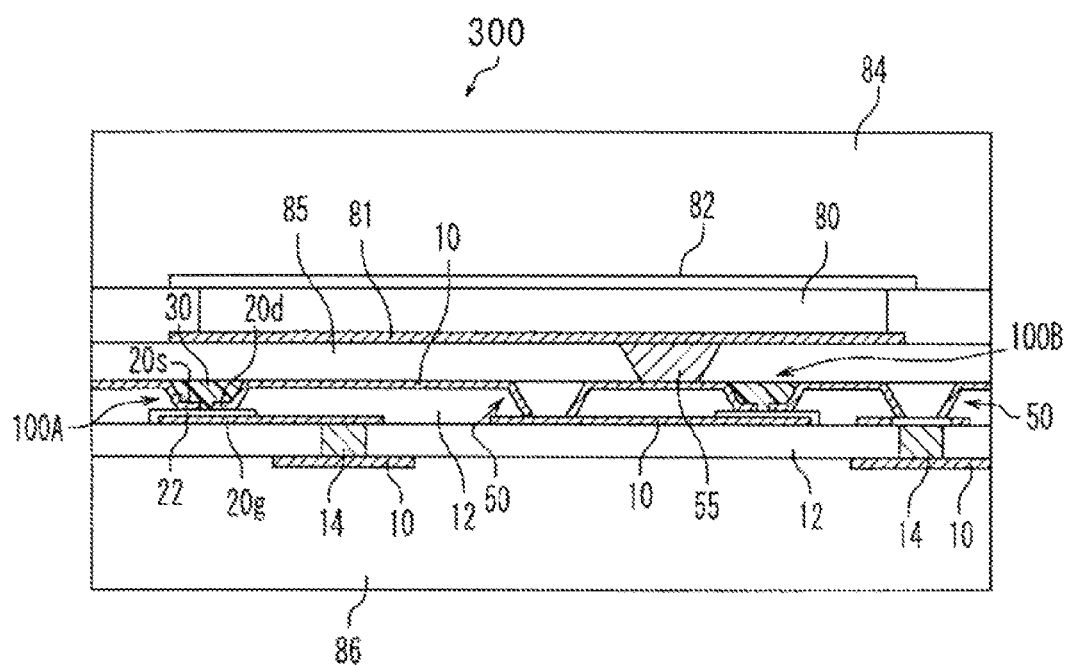
FIG. 13 is a sectional view schematically showing the constitution of a semiconductor device 300 according to the third embodiment of the present invention.

FIG. 13 is a sectional view showing the semiconductor device 300.

The semiconductor device 300 constitutes a part of the image display apparatus 500. The semiconductor device 300 is a light emitting element control device that has one organic EL element (light emitting element) 80 for each pixel of the image display apparatus 500, and controls the emission of light from the light emitting element 80, and therefore the same number of semiconductor devices 300 as the pixels of the image display apparatus 500 are included in the image display apparatus 500. The semiconductor device 300 will be described below with reference to FIG. 13.

Figure 14:
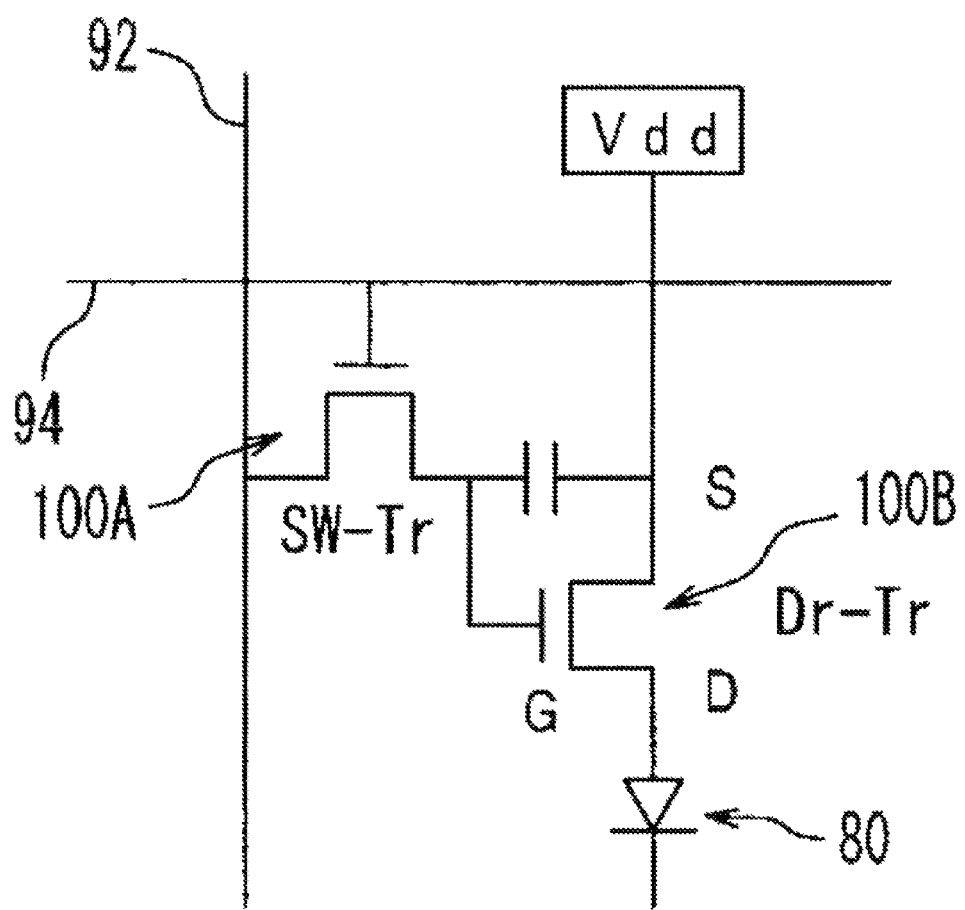
FIG. 14 is a diagram showing an equivalent circuit of the semiconductor device 300.
Figure 15:
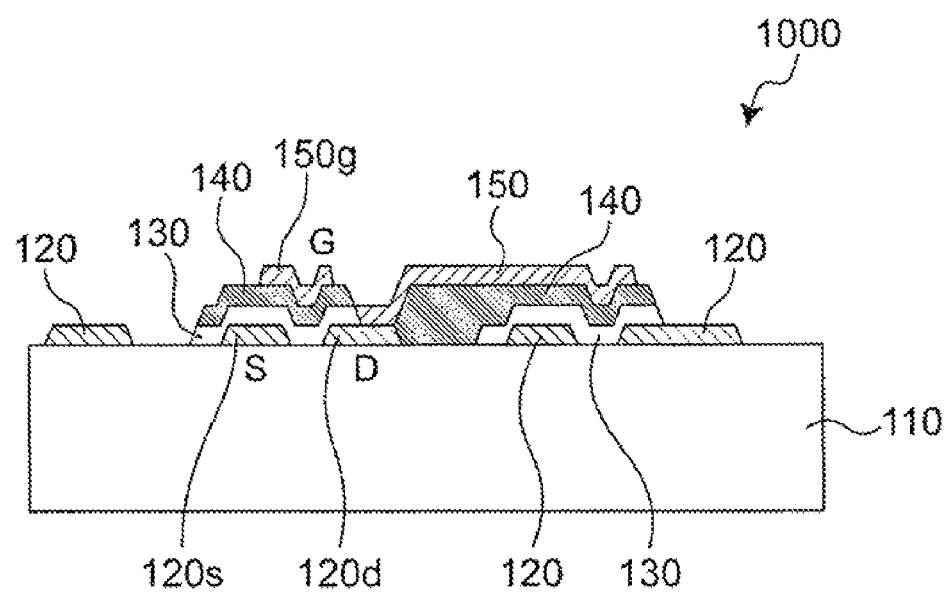
FIG. 15 is a sectional view schematically showing the constitution of a semiconductor device 1000 of the prior art.

The semiconductor device 300 has two semiconductor elements (semiconductor elements 100A, 100B) included in the semiconductor device (organic semiconductor device) 100 of the first embodiment, as represented by the equivalent circuit of FIG. 14.

Of the two semiconductor elements 100A and 100B, one is used as a switching transistor 100A and the other is used as a driver transistor 100B. The semiconductor elements 100A and 100B are disposed on a reinforcement film 86 (for example, a resin film such as PET, PEN).

The semiconductor elements 100A, 100B of this embodiment are formed under the organic EL element 80, and the semiconductor element 100B is connected with the organic EL element 80. Formed above the organic EL element 80 is a transparent electrode 82 that is electrically connected to the organic EL element 80, and is provided with a protective film (for example, a resin film such as PET, PEN) 84 formed thereon.

The wiring 92 shown in FIG. 14 is the data line, and is electrically connected to the electrically conductive layer 10 that is connected to the source electrode 20s of the semiconductor element 100A of FIG. 13, although not shown in FIG. 13. The wiring 94 is a selection line (switching line), and is electrically connected to the gate electrode 20g of the semiconductor element 100A.

The light emitting element 80 is driven to emit light by controlling the currents flowing in the data line 92 and in the switching line 94 by means of the driver sections 800, 850, thereby controlling the currents flowing from the driver transistor 100B to the organic EL element 80 and the transparent electrode 82 by means of the semiconductor element 100A. In other words, the semiconductor element 100A is used as a switching transistor that turns on or off the organic EL element (light emitting element) 80.

Depending on the constitution of the image display apparatus 500, three or more semiconductor elements such as transistor, instead of two (one semiconductor element 100A and one semiconductor element 100B), may be provided and the semiconductor elements of the semiconductor device 100 of this embodiment may also be provided as the third or further transistor.

Besides the semiconductor device 100, any of the semiconductor devices (semiconductor devices 100, 101, 102, 103, 200) of the present invention described in this specification may be used as the semiconductor element (the switching transistor 100A and the driver transistor 100B) of the semiconductor device 300.

All of the semiconductor devices and the semiconductor elements of the present invention are not limited to the application to the organic EL display, and these devices and elements may be used in other image display apparatuses (such as liquid crystal display apparatus), and also in electronic paper. Moreover, all of the semiconductor devices and the semiconductor elements of the present invention can be used in various applications (such as RF-ID, memory, MPU, solar cell and sensor) that are being studied as the fields of the application of the printing electronics.

The image display apparatus 500 may be used as other types of image display apparatus such as liquid crystal display or plasma display apparatus, besides the organic EL display apparatus, by replacing the organic EL elements described above with other type of light emitting element such as liquid crystal element or plasma light emitting element.

While the present invention has been described by way of preferred embodiments, the description is not restrictive and leaves the possibilities of various modifications. For example, the semiconductor device 100 is manufactured in correspondence to one device in the embodiment described above, although the invention is not limited to this and a method of manufacturing the semiconductor device in correspondence to a plurality of devices may also be employed. A roll-to-roll process may be employed as such a manufacturing method. The effects of the constitution of this embodiment can be exploited more conspicuously when an organic semiconductor material having higher mobility to be developed in the future is used, thus providing greater technological advantage.

The present application claims priority based on Japanese Patent Application No. 2007-205202. The disclosure of Japanese Patent Application No. 2007-205202 is incorporated by reference herein.

The present invention makes it possible to provide a semiconductor device that has a simple structure which utilizes the inter-layer connection structure and high density of integration.

The invention claimed is:

1. A semiconductor device comprising:
   a first resin film having a through hole penetrating from a first surface to a second surface thereof;
   a source electrode disposed along an inner wall of the through hole;
   a drain electrode disposed along the inner wall of the through hole;
   a gate electrode disposed on the second surface of the first resin film opposing the through hole;
      an insulating layer disposed at the bottom of the through hole, the insulating layer being disposed on the gate electrode; and
   an organic semiconductor disposed in the through hole so as to contact the source electrode and the drain electrode, the organic semiconductor making contact with at least a part of the insulating layer at the bottom of the through hole,
   wherein a channel is formed between the source electrode and the drain electrode, and a portion of the organic semiconductor which contacts the insulating layer is disposed in the channel,
   wherein the organic semiconductor has a hollow space, and a surface of the organic semiconductor which defines the hollow space extends along the inner wall and the bottom surface of the through hole, and
   wherein the hollow space of the organic semiconductor is filled with an insulating material.

2. The semiconductor device according to claim 1, further comprising a second resin film bonded to the second surface of the first resin film.

3. The semiconductor device according to claim 2, wherein the second resin film has a second through hole and a via conductor formed from an electrically conductive composite material in the second through hole.

4. The semiconductor device according to claim 1, wherein the source electrode has a source electrode extension extending over the insulating layer, the drain electrode has a drain electrode extension extending over the insulating layer, and the organic semiconductor contacts the insulating layer between the source electrode extension and the drain electrode extension.

5. The semiconductor device according to claim 4, wherein each of the source electrode extension and the drain electrode extension has a comb shape, and the source electrode extension and the drain electrode extension are disposed to oppose each other at a distance so as to mesh with each other.

6. The semiconductor device according to claim 1, wherein the insulating layer is formed so as to extend along the bottom of the through hole and the source electrode extension and the drain electrode extension extend along the insulating layer.

7. The semiconductor device according to claim 1, wherein the hollow space of the organic semiconductor is filled with an insulating material.

8. The semiconductor device according to claim 1, wherein the organic semiconductor is a high molecular organic semiconductor.

9. The semiconductor device according to claim 1, wherein the organic semiconductor is a low molecular organic semiconductor.

10. The semiconductor device according to claim 1, wherein the first resin film is formed from any one material selected from the group consisting of a polyimide resin, a polyamide resin, a polyethylene naphthalate resin and an aramid resin.

11. The semiconductor device according to claim 1, wherein the source electrode and the drain electrode are formed from a noble metal.

12. An image display apparatus comprising a display section having an array of light emitting elements and a drive circuit layer for driving the light emitting elements used in the display section, wherein the drive circuit layer includes the semiconductor device of claim 1.

13. The image display apparatus according to claim 12, wherein the semiconductor element of the semiconductor device is an ON/OFF switching transistor.

14. The image display apparatus according to claim 12, wherein the semiconductor element of the semiconductor device is a driver transistor for driving the light emitting element to emit light.

15. The image display apparatus according to claim 12, wherein the light emitting element is an organic electroluminescence element.

16. A method for manufacturing a semiconductor device, the method comprising:
   (1) forming an insulating layer and a gate electrode disposed on the insulating layer on a first surface of a first resin film and forming a through hole penetrating the first resin film from a second surface thereof to the insulating layer;
   (2) forming a source electrode and a drain electrode on the inner wall of the through hole; and
   (3) disposing an organic semiconductor in the through hole so as to make contact with the source electrode, the drain electrode and the insulating layer, wherein a channel is formed between the source electrode and the drain electrode, and a portion of the organic semiconductor which contacts the insulating layer is disposed in the channel, wherein the organic semiconductor has a hollow space, and a surface of the organic semiconductor which defines the hollow space extends along the inner wall and the bottom surface of the through hole, and wherein the hollow space of the organic semiconductor is filled with an insulating material.

17. The method for manufacturing a semiconductor device according to claim 16, wherein said step (1) includes a step of disposing the first surface of the first resin film on a second resin film having the gate electrode disposed on the surface thereof and having an insulating layer disposed on the gate electrode.

18. The method for manufacturing a semiconductor device according to claim 17, wherein said step (1) includes disposing the first resin film having the through hole formed therein in advance on the insulating layer of the second resin film.

19. The method for manufacturing a semiconductor device according to claim 16, wherein said step (2) includes providing the source electrode with a source electrode extension extending over the insulating layer, and providing the drain electrode with a drain electrode extension extending over the insulating layer, so as to bring the organic semiconductor and the insulating layer into contact with each other between the source electrode extension and the drain electrode extension.

* * * * *